US009165837B1

(12) United States Patent
Fronheiser et al.

(10) Patent No.: US 9,165,837 B1
(45) Date of Patent: Oct. 20, 2015

(54) METHOD TO FORM DEFECT FREE REPLACEMENT FINS BY H2 ANNEAL

(71) Applicant: GLOBALFOUNDRIES Inc., Grand Cayman (KY)

(72) Inventors: Jody Fronheiser, Delmar, NY (US); Murat Kerem Akarvardar, Saratoga Springs, NY (US); Ajey P. Jacob, Watervliet, NY (US); Steven Bentley, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/525,743

(22) Filed: Oct. 28, 2014

(51) Int. Cl.

| | |
|---|---|
| ***H01L 21/336*** | (2006.01) |
| ***H01L 21/00*** | (2006.01) |
| ***H01L 21/20*** | (2006.01) |
| ***H01L 21/8238*** | (2006.01) |
| ***H01L 21/3065*** | (2006.01) |
| ***H01L 21/762*** | (2006.01) |
| ***H01L 21/8234*** | (2006.01) |

(52) U.S. Cl.
CPC .... *H01L 21/823821* (2013.01); *H01L 21/3065* (2013.01); *H01L 21/76224* (2013.01); *H01L 21/823431* (2013.01)

(58) Field of Classification Search
CPC ............ H01L 21/76224; H01L 21/845; H01L 21/823431; H01L 21/823821; H01L 21/3065; H01L 21/36
USPC .................. 438/283, 478, 157, 424, 221, 197
See application file for complete search history.

(56) References Cited

U.S. PATENT DOCUMENTS

| | | | | |
|---|---|---|---|---|
| 8,268,729 B2 * | 9/2012 | Cheng et al. | .................. | 438/753 |
| 8,497,177 B1 * | 7/2013 | Chang et al. | .................. | 438/283 |
| 8,829,606 B1 * | 9/2014 | van Dal | ......................... | 257/330 |
| 2013/0313619 A1 * | 11/2013 | Fumitake | ...................... | 257/288 |

OTHER PUBLICATIONS

J. Lee et al., Hydrogen Annealing Effect on DC and Low-Frequency Noise Characteristics in CMOS FinFETs, IEEE Electron Device Letters, vol. 24, No 3, Mar. 2003, pp. 186-188.

M. Lee et al., "Thermal annealing in hydrogen for 3-D profile transformation on silicon-on-insulator and sidewall roughness reduction", Journal of Microelectromechanical Systems, vol. 15, No. 2, Apr. 2006, pp. 338-343.

* cited by examiner

*Primary Examiner* — Shouxiang Hu
(74) *Attorney, Agent, or Firm* — Ditthavong & Steiner, P.C.

(57) ABSTRACT

Methods of forming a defect free heteroepitaxial replacement fin by annealing the sacrificial Si fin with $H_2$ prior to STI formation are provided. Embodiments include forming a Si fin on a substrate; annealing the Si fin with $H_2$; forming a STI layer around the annealed Si fin; annealing the STI layer; removing a portion of the annealed Si fin by etching, forming a recess; forming a replacement fin in the recess; and recessing the annealed STI layer to expose an active replacement fin.

20 Claims, 2 Drawing Sheets

METHOD TO FORM DEFECT FREE REPLACEMENT FINS BY H2 ANNEAL

TECHNICAL FIELD

The present disclosure relates to a replacement fin formation process for fin-type field-effective transistor (FinFET) devices. The present disclosure is particularly applicable to sub 14 nanometer (nm) technology nodes and beyond.

BACKGROUND

The replacement fin process is an integration method to achieve semiconductor fins of silicon germanium (SiGe), $Si_{1-x}Ge_x$, silicon carbide (SiC), silicon germanium carbide (SiGeC), germanium (Ge), or combined group III and group IV elements (III-V). However, a defect free replacement fin approach has not been achieved on standard orientation (100) wafers with fin sidewalls and electrical transport in the <110> crystalline direction. For example, a known approach of replacement fin integration is illustrated in FIGS. 1A through 1D. Adverting to FIG. 1A, silicon (Si) fins 101 and 103 are formed on a Si substrate 105 by etching. In particular, the sidewalls of the Si fins 101 and 103 have a degree of roughness as a result of the etching process. Although exaggerated for illustration purposes, the roughness need only be on the angstrom (Å) level to provide nucleation sites for defect propagation. A shallow trench isolation (STI) layer 107 is then filled around the Si fins 101 and 103 and annealed (not shown for illustrative convenience), as depicted in FIG. 1B. Adverting to FIG. 1C, the Si fins 101 and 103 are recessed, forming recesses 109 and 111. Next, replacement SiGe fins 113 and 115 are formed in the recesses 109 and 111, respectively, by epitaxial (epi) growth, as depicted in FIG. 1D. However, the roughness at the SiGe or Ge to silicon oxide ($SiO_2$) sidewall interface (which is transferred into the $SiO_2$ sidewall from the Si fin prior to replacement) provides nucleation sites for defect propagation during the epi process forming the replacement SiGe fins 113 and 115.

A need therefore exists for methodology enabling formation of defect free replacement fins.

SUMMARY

An aspect of the present disclosure is a method of forming defect free heteroepitaxial replacement fins by annealing the sacrificial Si fins with hydrogen ($H_2$) prior to STI formation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a Si fin on a substrate; annealing the Si fin with $H_2$; forming a STI layer around the annealed Si fin; annealing the STI layer; removing a portion of the annealed Si fin by etching, forming a recess; forming a replacement fin in the recess; and recessing the annealed STI layer to expose an active replacement fin.

Aspects of the present disclosure include forming the Si fin with top and bottom dimensions of the active region of the fin being the same or trapezoidal with top and bottom parts of the fin having different dimensions. Other aspects include forming the Si fin to a height of 100 to 200 nm. Further aspects include annealing the fin at a temperature of 600° C. to 900° C. Another aspect includes annealing the Si fin at a pressure of 10 torr to 600 torr. Additional aspects include annealing the fin for 1 minute to 3 minutes. Other aspects include forming the recess to a depth of 10 nm to 200 nm. Further aspects include forming the replacement fin of SiGe, $Si_{1-x}Ge_x$, SiC, SiGeC, Ge, or III-V. Another aspect includes forming the replacement fin by epitaxial growth. Additional aspects include recessing the annealed STI layer to a depth of 10 nm to 60 nm to expose the active replacement fin for gate formation.

Another aspect of the present disclosure is a method including: forming Si fins on a substrate; annealing the Si fins with $H_2$; filling space around and between the annealed fins with a STI material; annealing the STI material; removing an upper portion of each annealed Si fin by etching, forming a recess; epitaxially growing replacement fins in each recess; and recessing the annealed STI material to expose active replacement fins.

Aspects include of the present disclosure forming each silicon fin with top and bottom dimensions of the active region of the fin being the same or trapezoidal with top and bottom parts of the fin having different dimensions. Other aspects include annealing the Si fins at a temperature of 600° C. to 900° C. for 1 minute to 3 minutes. Further aspects include annealing the Si fins at a pressure of 10 torr to 600 torr. Another aspect include forming each recess to a depth of 10 nm to 200 nm. Additional aspects include forming the replacement fin of SiGe, $Si_{1-x}Ge_x$, SiC, SiGeC, Ge, or III-V. Other aspects include recessing the annealed STI layer 10 nm to 60 nm to expose the active replacement fins for gate formation.

A further aspect of the present disclosure is a method including: forming Si fins on a Si substrate, each to a height of 100 nm to 200 nm; annealing the Si fins with $H_2$; filling space around and between the annealed fins with a STI material; annealing the STI material; removing an upper portion of each annealed Si fin by etching, forming a recess to a depth of 10 nm to 200 nm; epitaxially growing a replacement fin of SiGe, $Si_{1-x}Ge_x$, SiC, SiGeC, Ge, or III-V in each recess; and recessing the annealed STI material to a depth of 10 nm to 60 nm to expose each active replacement fin for gate formation. Aspects of the present disclosure include forming each silicon fin with top and bottom dimensions of the active region of the fin being the same or trapezoidal with top and bottom parts of the fin having different dimensions. Other aspects include annealing the Si fins for 1 minute to 3 minutes at a temperature of 600° C. to 900° C. and at a pressure of 10 torr to 600 torr.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of defect propagation at the SiGe/Ge to $SiO_2$ sidewall interface attendant upon etching sacrificial Si fins and replacing them, for example, with SiGe/Ge fins.

Methodology in accordance with embodiments of the present disclosure includes forming a Si fin on a substrate. The Si fin is annealed with $H_2$ and a STI layer is formed around the annealed Si fin. The STI layer is annealed and a portion of the annealed Si fin is removed by etching, forming a recess. A replacement fin is formed in the recess and the annealed STI layer is recessed to expose an active replacement fin.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figures 1A, 1B, 1C, 1D:
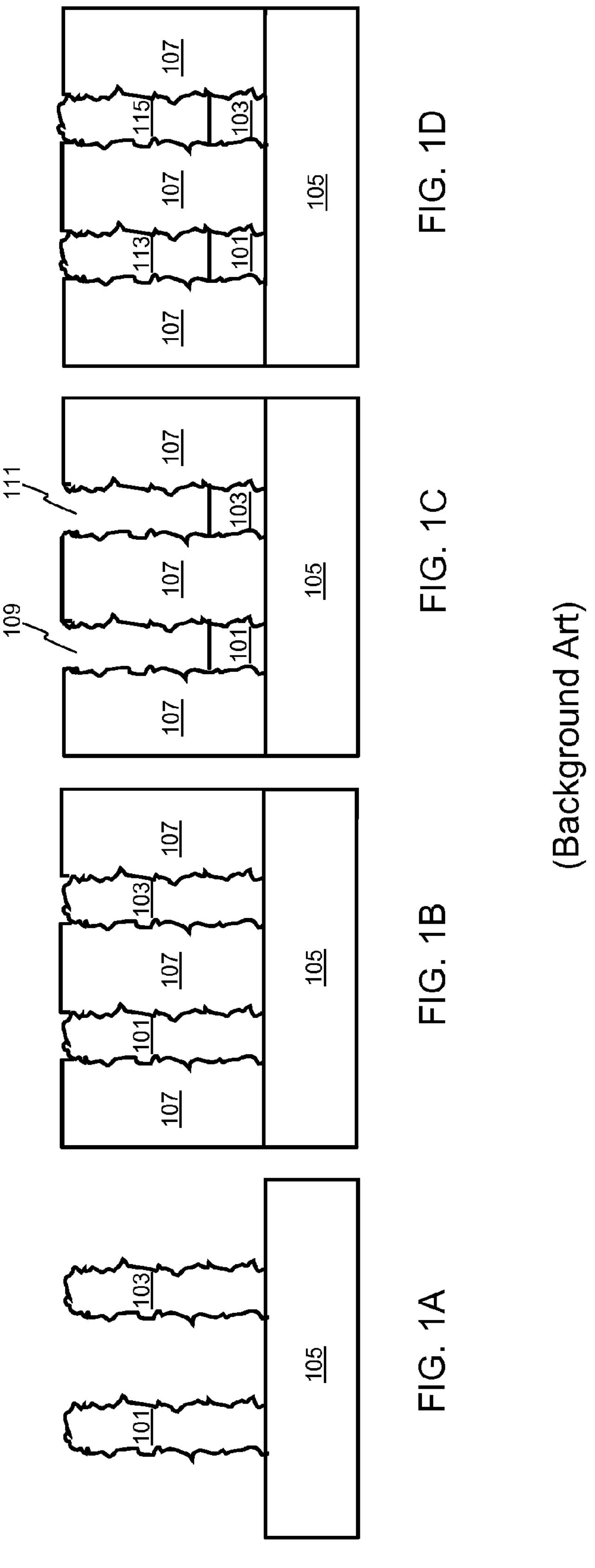
FIGS. 1A through 1D schematically illustrate sequential steps of a background method of forming SiGe replacement fins.
Figure 2:
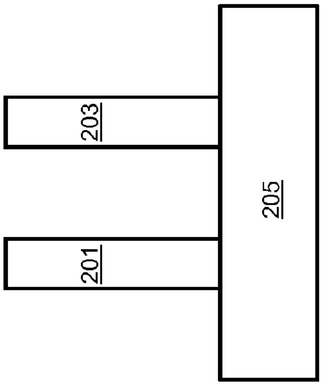
FIGS. 2 through 6 schematically illustrate sequential steps of a method of forming defect free heteroepitaxial replacement fins, e.g., SiGe, $Si_{1-x}Ge_x$, SiC, SiGeC, Ge, or III-V, in accordance with an exemplary embodiment.
Figure 3:
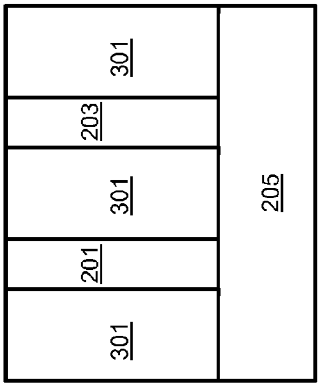

Adverting to FIG. 2, Si fins 201 and 203 are formed on a Si substrate 205 by etching. The Si fins 201 and 203 may, for example, be formed with top and bottom dimensions of the active region of the fin being the same, i.e., the sidewalls are formed perfectly vertical, or trapezoidal with top and bottom parts of the fin having different dimensions. In particular, the Si fins 201 and 203 may, for example, be formed with a bottom width of 3 nm to 20 nm and a top width of 3 nm to 10 nm. In addition, the Si fins 201 and 203 may, for example, be formed with a total height of 100 nm to 200 nm. The Si fins 201 and 203 are then annealed with $H_2$. The annealed Si fins 201 and 203 may, for example, be annealed at a temperature of 600° C. to 900° C., for 1 minute to 3 minutes, and at a pressure of 10 torr to 600 torr. In general, a higher temperature requires a higher pressure to minimize Si reflow and the fins pooling. For example, the fins may be annealed at 790° C. and 600 torr for 1 min., but followed by 150 torr for an additional minute. Next, a STI layer 301 is formed around the annealed Si fins 201 and 203, as depicted in FIG. 3. Annealing the Si fins 201 and 203 prior to forming the STI layer 301 reduces the surface roughness of the Si fins 201 and 203 because surface atoms tend to leave from convex corners and accumulate at concave corners due to the surface energy minimization from the annealing process. Therefore, the roughness from etching the Si fins is removed instead of being transferred to the STI sidewalls. The STI layer 301 is then also annealed (not shown for illustrative convenience).

Figure 4:
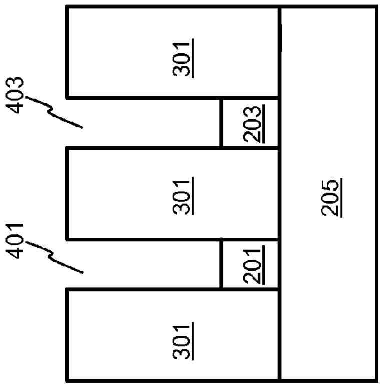
Figure 5:
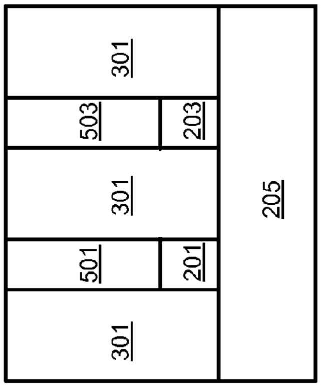
Figure 6:
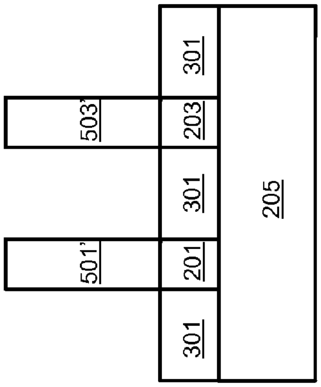

Adverting to FIG. 4, a portion of the annealed Si fins 201 and 203 may, for example, be removed by etching, forming recesses 401 and 403, respectively. The recesses 401 and 403 may, for example, be formed by recessing the annealed Si fins 201 and 203 to a depth of 10 nm to 200 nm. Thereafter, replacement fins 501 and 503 may, for example, be formed of SiGe in the recesses 401 and 403, respectively, by epitaxial growth, forming defect free replacement SiGe fins 501 and 503 as depicted in FIG. 5. Adverting to FIG. 6, the STI layer 301 may then, for example, be recessed to a depth of 10 nm to 60 nm to expose the active SiGe replacement fins 501' and 503' for the gate formation. Thereafter, a gate (not shown for illustrative convenience) may, for example, be wrapped around the active SiGe replacement fins 501' and 503' rather than being formed on the substrate 205.

The replacement fins 501 and 503 of FIG. 5 may also, for example, be formed of $Si_{1-x}Ge_x$, SiC, SiGeC, Ge, or III-V. In the case of III-V, a buffer layer may, for example, be grown on the Si fins 201 and 203 and then a channel layer grown on top of the buffer layer, e.g., an indium gallium arsenide ($In_{0.5}GaAs$) channel layer grown on a gallium arsenide (GaAs) buffer layer. In particular, the buffer layer may, for example, include SiGe/Ge, GaAs, indium aluminum arsenide (InAlAs), indium phosphide (InP), indium arsenide (InAs), gallium antimonide (GaSb), aluminum anitmonide (AlSb), or ternary compounds of those buffer elements. The channel layer may, for example, include InGaAs, InAs, or indium gallium antimonide (InGaSb). In addition, the group III ratios may in each case be considered a variable.

The embodiments of the present disclosure can achieve several technical effects including achieving defect free replacement fins by smoothing the sidewall roughness of the sacrificial Si fins prior to STI formation. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial application in any of various types of semiconductor devices with replacement fins, particularly for 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:

forming a silicon (Si) fin on a substrate;

annealing the Si fin with hydrogen ($H_2$);

forming a shallow trench isolation (STI) layer around the annealed Si fin;

annealing the STI layer;

removing a portion of the annealed Si fin by etching, forming a recess; forming a replacement fin in the recess; and recessing the annealed STI layer to expose an active replacement fin.

2. The method according to claim 1, comprising forming the Si fin with top and bottom dimensions of the active region of the fin being equal or trapezoidal with top and bottom parts of the fin having different dimensions.

3. The method according to claim 1, comprising forming the Si fin to a height of 100 to 200 nm.

4. The method according to claim 1, comprising annealing the fin at a temperature of 600° C. to 900° C.

5. The method according to claim 1, comprising annealing the Si fin at a pressure of 10 torr to 600 torr.

6. The method according to claim 1, comprising annealing the fin for 1 minute to 3 minutes.

7. The method according to claim 1, comprising forming the recess to a depth of 10 nm to 200 nm.

8. The method according to claim 1, comprising forming the replacement fin of silicon germanium (SiGe), $Si_{1-x}Ge_x$, silicon carbide (SiC), silicon germanium carbide (SiGeC), germanium (Ge), or combined group III and group IV elements (III-V).

9. The method according to claim 1, further comprising forming the replacement fin by epitaxial growth.

10. The method according to claim 1, comprising recessing the annealed STI layer to a depth of 10 nm to 60 nm to expose the active replacement fin for gate formation.

11. A method comprising:

forming silicon (Si) fins on a substrate;

annealing the Si fins with hydrogen ($H_2$);

filling space around and between the annealed fins with a shallow trench isolation (STI) material;

annealing the STI material;

removing an upper portion of each annealed Si fin by etching, forming a recess;

epitaxially growing replacement fins in each recess; and recessing the annealed STI material to expose active replacement fins.

12. The method according to claim 11, comprising forming each silicon fin with top and bottom dimensions of the active region of the fin being equal or trapezoidal with top and bottom parts of the fin having different dimensions.

13. The method according to claim 11, comprising annealing the Si fins at a temperature of 600° C. to 900° C. for 1 minute to 3 minutes.

14. The method according to claim 11, comprising annealing the Si fins at a pressure of 10 torr to 600 torr.

15. The method according to claim 11, comprising forming each recess to a depth of 10 nm to 200 nm.

16. The method according to claim 11, comprising forming the replacement fin of silicon germanium (SiGe), $Si_{1-x}Ge_x$, silicon carbide (SiC), silicon germanium carbide (SiGeC), germanium (Ge), or combined group III and group IV elements (III-V).

17. The method according to claim 11, comprising recessing the annealed STI layer 10 nm to 60 nm to expose the active replacement fins for gate formation.

18. A method comprising:

forming silicon (Si) fins on a Si substrate, each to a height of 100 nm to 200 nm;

annealing the Si fins with hydrogen ($H_2$);

filling space around and between the annealed fins with a shallow trench isolation (STI) material;

annealing the STI material;

removing an upper portion of each annealed Si fin by etching, forming a recess to a depth of 10 nm to 200 nm;

epitaxially growing a replacement fin of silicon germanium (SiGe), $Si_{1-x}Ge_x$, silicon carbide (SiC), silicon germanium carbide (SiGeC), germanium (Ge), or combined group III and group IV elements (III-V) in each recess; and recessing the annealed STI material to a depth of 10 nm to 60 nm to expose each active replacement fin for gate formation.

19. The method according to claim 18, comprising forming each silicon fin with top and bottom dimensions of the active region of the fin being equal or trapezoidal with top and bottom parts of the fin having different dimension.

20. The method according to claim 18, comprising annealing the Si fins for 1 minute to 3 minutes at a temperature of 600° C. to 900° C. and at a pressure of 10 torr to 600 torr.

* * * * *